United States Patent [19]
Kim et al.

[11] Patent Number: 5,981,309
[45] Date of Patent: *Nov. 9, 1999

[54] METHOD FOR FABRICATING CHARGE COUPLED DEVICE IMAGE SENSOR

[75] Inventors: Hang Kyoo Kim, Daeku-si; Yong Park; Sun Choi, both of Kyungki-do, all of Rep. of Korea

[73] Assignee: LG Semicon Co., Ltd., Chungcheongbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/934,769

[22] Filed: Sep. 22, 1997

[30] Foreign Application Priority Data

Jun. 4, 1997 [KR] Rep. of Korea ............... 97/23176

[51] Int. Cl.⁶ .................... H01L 21/00; H01L 21/339; H01L 21/28; H01L 21/44
[52] U.S. Cl. .................... 438/60; 438/76; 438/146; 438/577; 438/951
[58] Field of Search ................ 438/59, 75, 76, 438/144, 146, 951, 577

[56] References Cited

U.S. PATENT DOCUMENTS

| | | | |
|---|---|---|---|
| 4,149,307 | 4/1979 | Henderson | 29/571 |
| 4,268,951 | 5/1981 | Elliott et al. | 29/571 |
| 4,594,604 | 6/1986 | Kub | 357/24 |
| 4,677,453 | 6/1987 | Matsumoto et al. | 357/30 |
| 4,912,545 | 3/1990 | Go | 357/67 |
| 5,192,990 | 3/1993 | Stevens | 257/229 |

*Primary Examiner*—Brian Dutton
*Attorney, Agent, or Firm*—Morgan, Lewis & Bockius LLP

[57] ABSTRACT

A method for fabricating a CCD image sensor includes the steps of forming a P type well in a surface of a semiconductor substrate, forming a buried CCD (BCCD) in a surface of the P type well, forming an offset gate and a reset gate on the BCCD at a predetermined interval, forming a floating diffusion region in the BCCD between the offset gate and the reset gate, forming a mask layer on an entire surface of the semiconductor substrate to form a contact hole in the floating diffusion region, forming a metal layer on the entire surface of the semiconductor substrate including the contact hole, and selectively removing the metal layer on the mask layer together with the mask layer to form a floating gate in the contact hole.

9 Claims, 7 Drawing Sheets

METHOD FOR FABRICATING CHARGE COUPLED DEVICE IMAGE SENSOR

BACKGROUND OF THE INVENTION

1. Field of the Invention

The present invention relates to a charge coupled device (CCD), and more particularly, to a method for fabricating a CCD image sensor.

2. Discussion of the Related Art

Generally, a solid-state image sensor includes a plurality of photoelectric conversion regions, a plurality of vertical charge transfer regions, a horizontal charge transfer region, and a floating diffusion region. The photoelectric conversion regions are disposed at a predetermined interval in a matrix arrangement and convert an optical signal to an electrical signal to produce image charges. The vertical charge transfer regions are formed between the respective photoelectric conversion regions in vertical direction and transfer the image charges produced in the photoelectric conversion regions in vertical direction. The horizontal charge transfer region transfers the image charges transferred in the vertical direction in horizontal direction. The floating diffusion region senses the image charges transferred in the horizontal direction and outputs them to peripheral circuits.

Figure 1A:
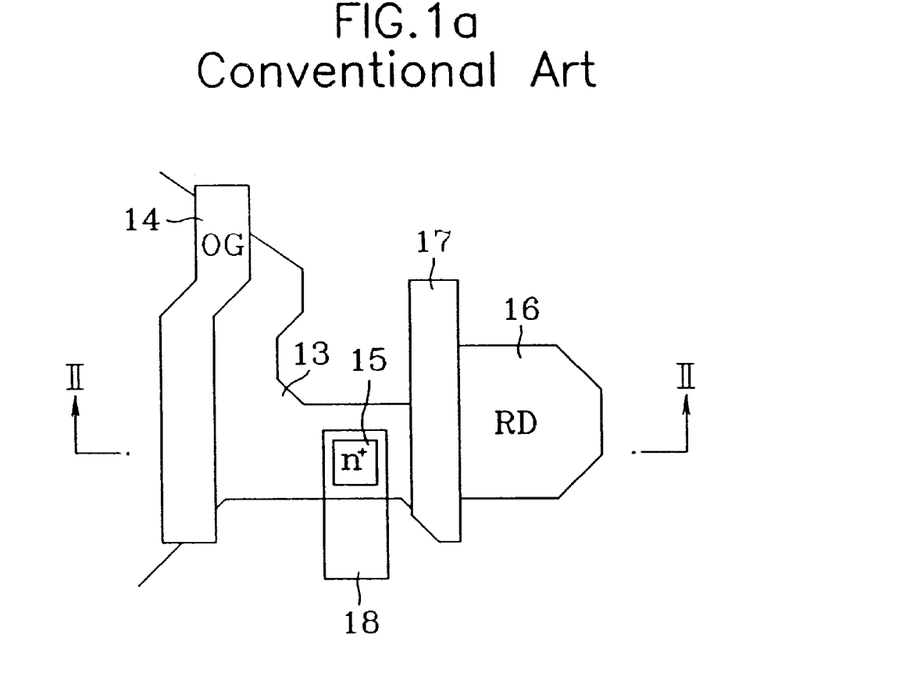
FIG. 1a is a plan view illustrating a conventional floating diffusion.
Figure 1B:
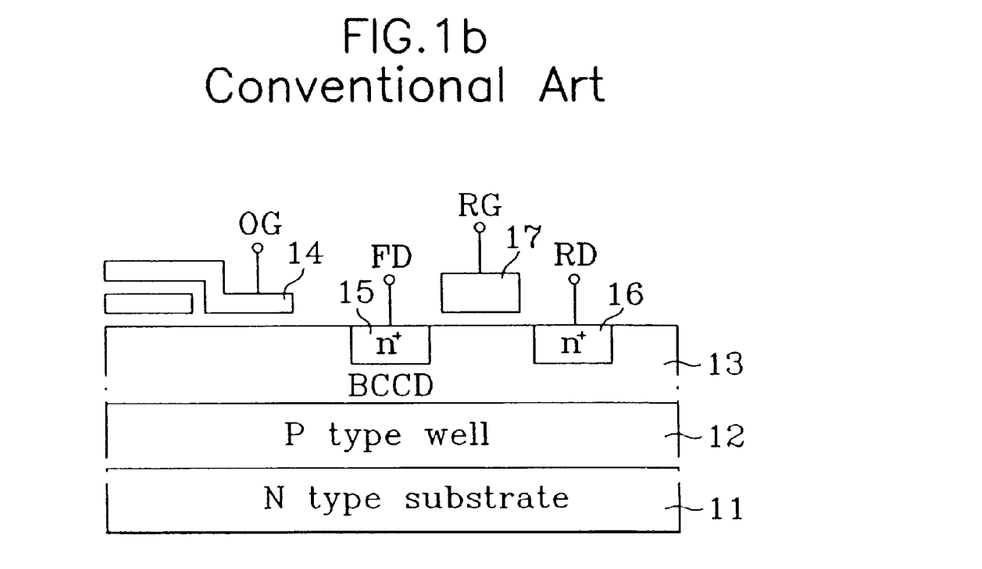

FIG. 1a is a plan view of a conventional floating diffusion. FIG. 1b is a sectional view of a conventional floating diffusion taken along II—II line of FIG. 1a.

The floating diffusion FD is formed at the end of the horizontal charge transfer region and includes a P-well 12, a buried charge coupled device (BCCD) 13, an offset gate (OG) 14, a floating diffusion region 15, a reset drain region 16, a reset gate 17, and a charge detector. The P-well 12 is formed on a surface of an N type substrate 11. The BCCD 13 is formed in a surface of the P-well 12. The offset gate 14 is formed at a top portion of the end of the BCCD 13 and transfers charges transferred to the end of the BCCD 13. The floating diffusion region 15 is formed at the end of the BCCD 13 and senses the charges transferred through the offset gate 14. The reset drain region 16 is formed at one side of the floating diffusion region 15 and resets the sensed charges. The reset gate 17 is formed at a top portion between the floating diffusion region 15 and the reset drain region 16 and transfers the sensed charges to the reset drain region 16. The charge detector (not shown) is formed of transistors which are connected to a floating gate 18 of the floating diffusion region 15 to sense the charges.

In the aforementioned conventional floating diffusion, a current flows from the floating diffusion region 15 to the reset drain region 16 if a bias is applied to the reset gate 17 and the reset drain region 16.

A method for fabricating the conventional CCD image sensor will be described with reference to FIG. 2a to FIG. 2f.

FIG. 2a to FIG. 2f are sectional views illustrating fabricating process steps of a conventional CCD image sensor.

Figure 2A:
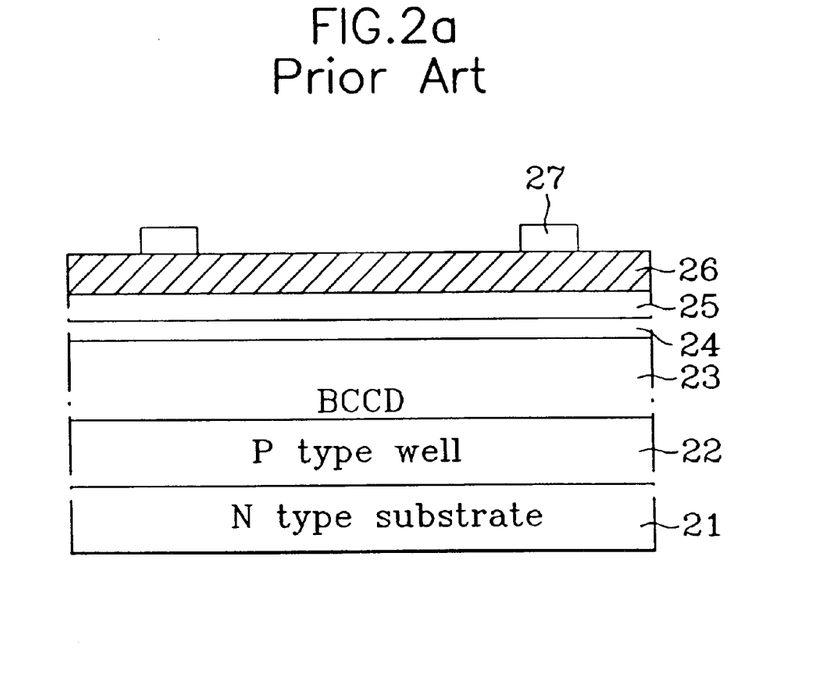
FIG. 2a to FIG. 2f are sectional views illustrating fabricating process steps of a conventional CCD image sensor.

As illustrated in FIG. 2a, a P-well 22 is formed on a surface of an N type semiconductor substrate 21. Ions are implanted into a predetermined region of the P-well 22 to form a BCCD 23 which is used as a horizontal charge transfer channel.

A gate oxide film 24 and a nitride film 25 for a gate insulation are sequentially formed on an entire surface of the N type semiconductor substrate 21 including the BCCD 23. A polysilicon 26 is formed on the nitride film 25. A first photoresist 27 is deposited on the polysilicon 26 and patterned by exposure and developing processes.

Figure 2B:
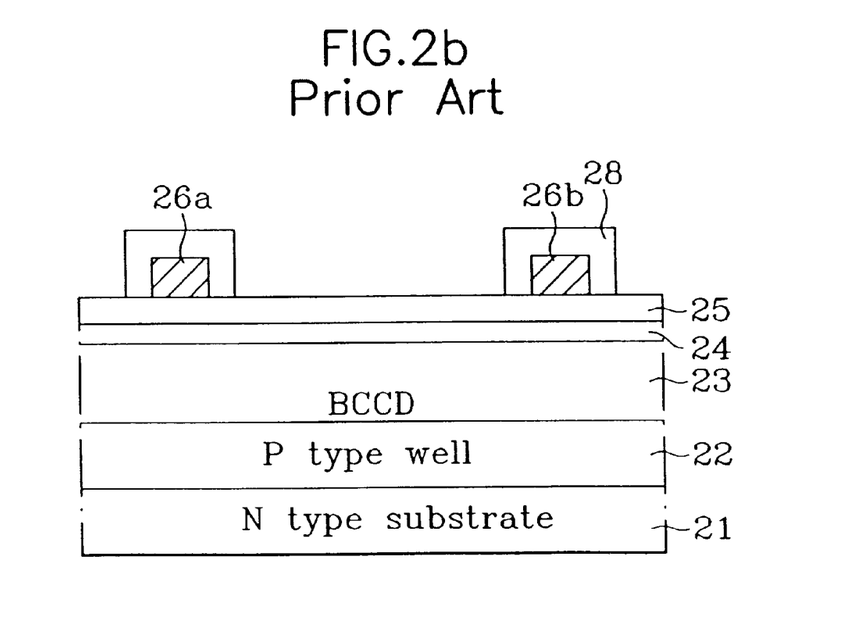

As illustrated in FIG. 2b, the polysilicon 26 is selectively removed using the patterned first photoresist 27 as a mask to form an offset gate 26a and a reset gate 26b.

Subsequently, an oxide film 28 is formed on the entire surface of the N type semiconductor substrate including the offset gate 26a and the reset gate 26b. The oxide film 28 is selectively removed to remain at top portions and side portions of the offset gate 26a and the reset gate 26b.

Figure 2C:
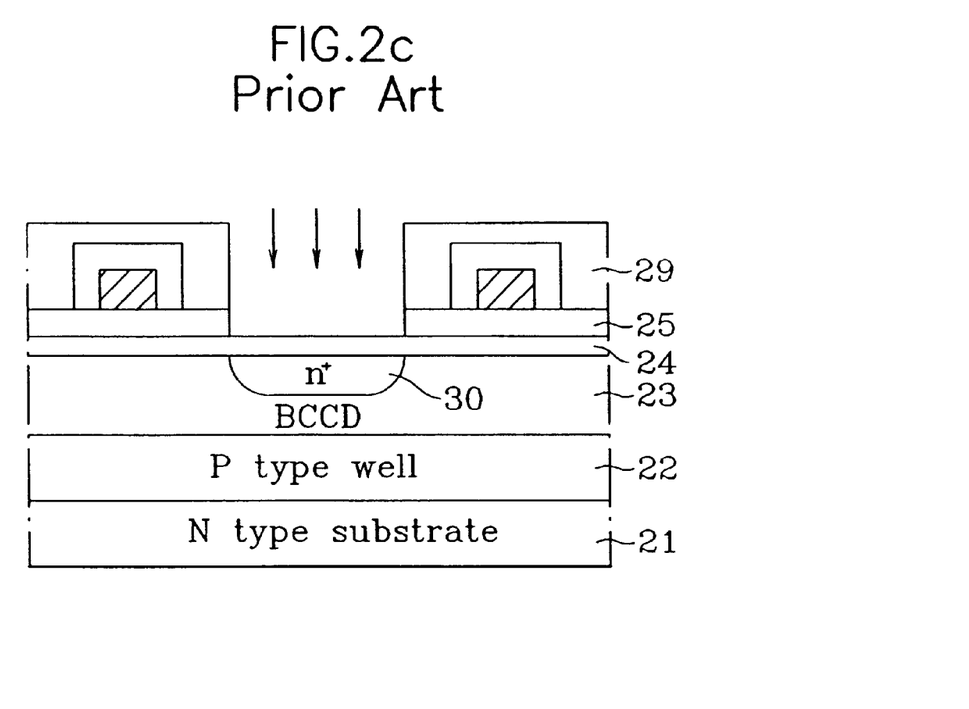

As illustrated in FIG. 2c, a second photoresist 29 is deposited on the entire surface of the N type semiconductor substrate 21 including the oxide film 28 and patterned by exposure and developing processes.

The nitride film 25 is then selectively removed using the patterned second photoresist 29 as a mask to partially expose a surface of the gate oxide film 24.

Thereafter, impurity ions are implanted into the entire surface of the N type semiconductor substrate 21 using the patterned second photoresist 29 as a mask to form a floating diffusion region 30 for ohmic contact in a predetermined region of the BCCD 23.

Figure 2D:
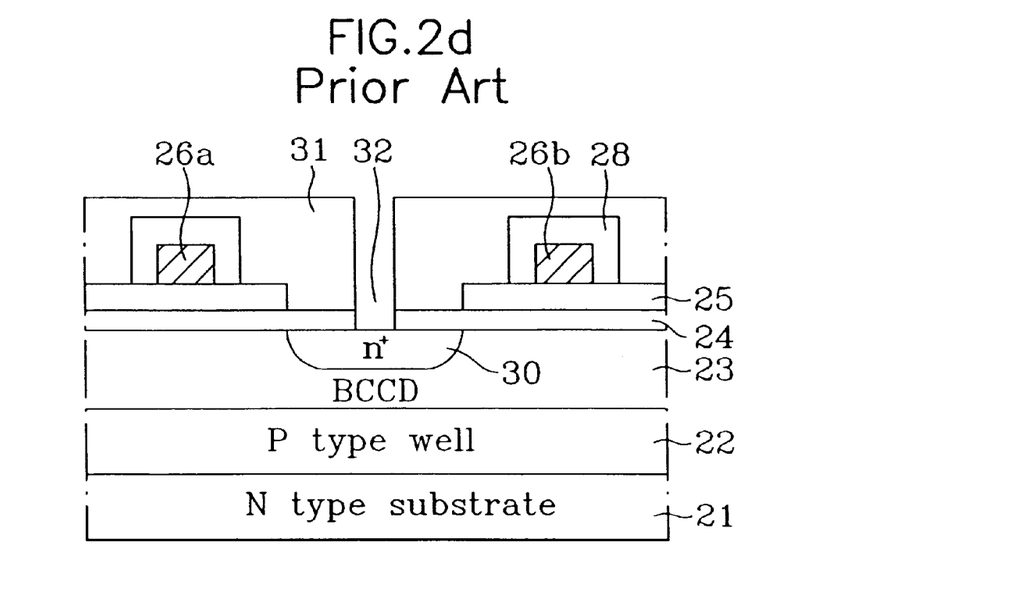

As illustrated in FIG. 2d, the second photoresist 29 is removed. A third photoresist 31 is deposited on the entire surface of the N type semiconductor substrate 21 and patterned by exposure and developing processes.

Subsequently, the gate oxide film 24 is selectively removed using the patterned photoresist 31 as a mask to partially expose a surface of the floating diffusion region 30, so that a contact hole 32 is formed.

Figure 2E:
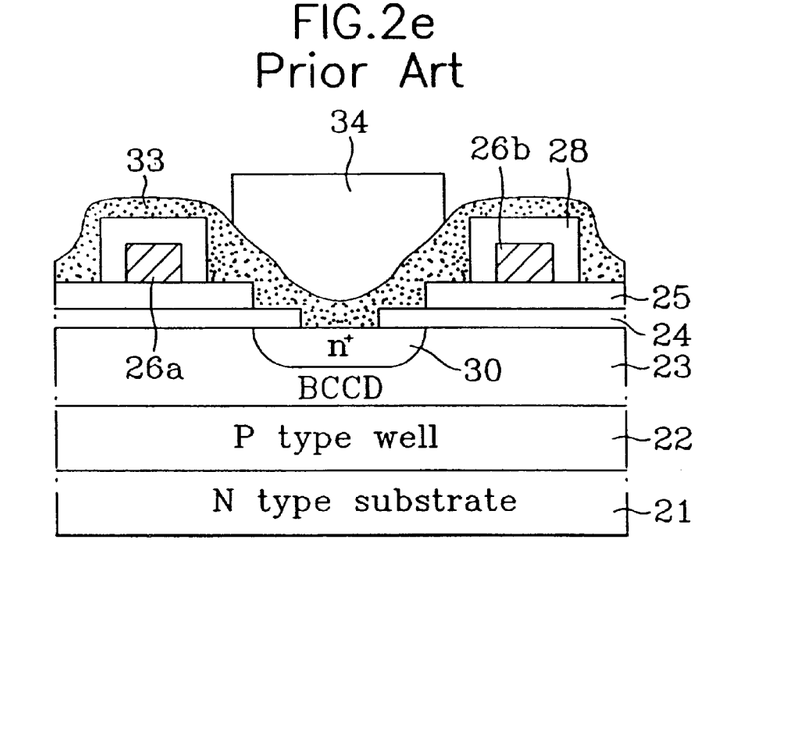

As illustrated in FIG. 2e, the third photoresist 31 is removed. A metal layer 33 is formed on the entire surface of the N type semiconductor substrate 21 including the contact hole 32. A fourth photoresist 34 is deposited on the metal layer 33 and then patterned by exposure and developing processes.

Figure 2F:
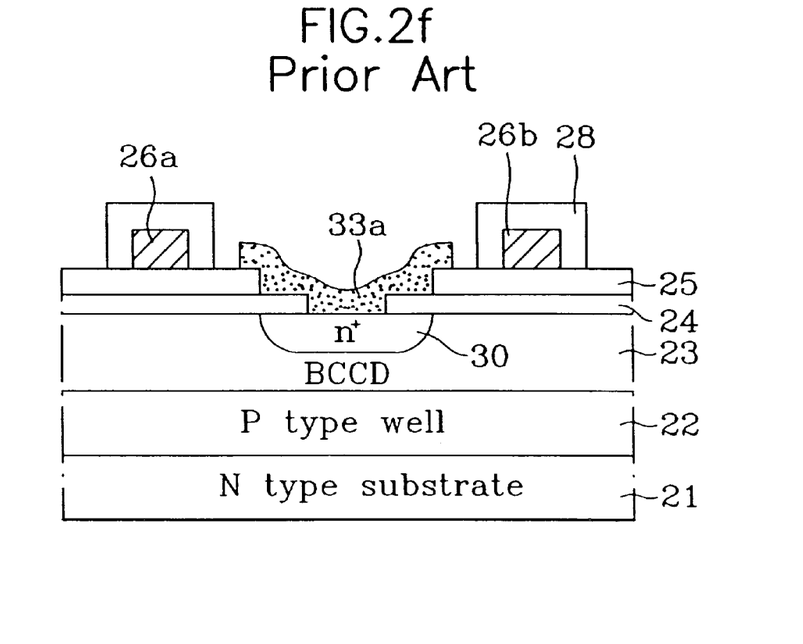

As illustrated in FIG. 2f, the metal layer 33 is patterned using the patterned fourth photoresist 34 as a mask to ohmic contact with the floating diffusion region 30. As a result, a floating gate 33a is formed. The floating gate 33a outputs image charges in the contact hole 32 and at a top portion of the nitride film 25 adjacent to the contact hole 32 to peripheral circuits (not shown).

Generally, overall charges produced by light can be expressed as Qsig=Cin*Vout, where Cin is overall capacitance applied to the floating diffusion region through a sensing amplifier and Vout is a sensing voltage in the floating diffusion region.

In addition, Vout=Qsig/Cin can be achieved by the above expression. In this case, the larger Cin is, the lower the sensing voltage of the floating diffusion region is.

The conventional method for fabricating a CCD has a problem.

That is, since the floating gate is widely formed around the contact hole including the contact hole to avoid misalignment of the floating gate which is used for ohmic contact with the floating diffusion region, parasitic capacitance occurs in the floating diffusion region. As a result, there results in limitation in increasing the sensing voltage of the floating diffusion.

SUMMARY OF THE INVENTION

Accordingly, the present invention is directed to a method for fabricating a CCD image sensor that substantially obviates one or more of the problems due to limitations and disadvantages of the related art.

An object of the present invention is to provide a method for fabricating a CCD image sensor in which a floating diffusion region is minimized to increase sensing voltage thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a CCD image sensor according to the present invention includes the steps of forming a P type well in a surface of a semiconductor substrate, forming a buried CCD (BCCD) in a surface of the P type well, forming an offset gate and a reset gate on the BCCD at a predetermined interval, forming a floating diffusion region in the BCCD between the offset gate and the reset gate, forming a mask layer on an entire surface of the semiconductor substrate to form a contact hole in the floating diffusion region, forming a metal layer on the entire surface of the semiconductor substrate including the contact hole, and selectively removing the metal layer on the mask layer together with the mask layer to form a floating gate in the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1b is a sectional view illustrating a conventional floating diffusion taken along II—II line of FIG. 1a;

DETAILED DESCRIPTION OF THE PREFERRED EMBODIMENTS

Reference will now be made in detail to the preferred embodiments of the present invention, examples of which are illustrated in the accompanying drawings.

Figure 3A:
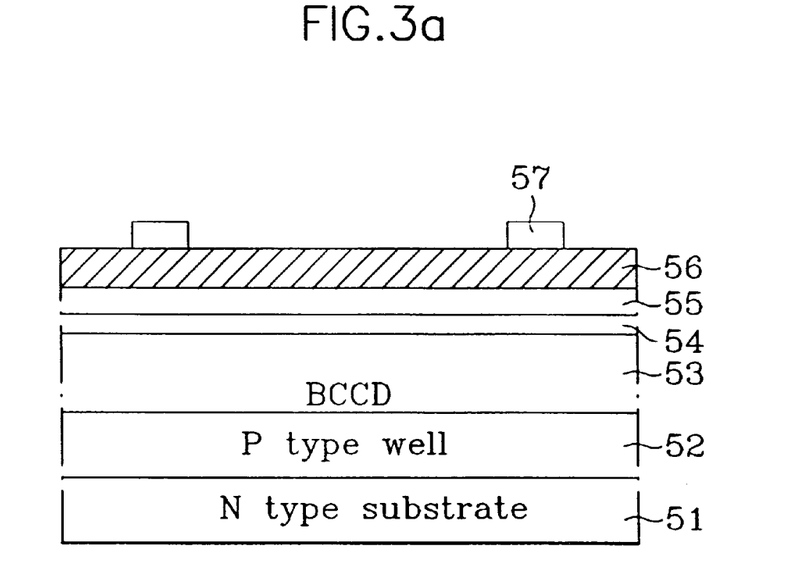
FIG. 3a to FIG. 3f are sectional views illustrating fabricating process steps of CCD image sensor according to the present invention.

As illustrated in FIG. 3a, a P-well 52 is formed on a surface of an N type semiconductor substrate 51. Ions are implanted into a predetermined region of the P-well 22 to form a BCCD 53 which is used as a horizontal charge transfer channel.

A gate oxide film 54 and a nitride film 55 for a gate insulation are sequentially formed on an entire surface of the N type semiconductor substrate 51 including the BCCD 53. A polysilicon 56 is formed on the nitride film 55. A first photoresist 57 is deposited on the polysilicon 56 and patterned by exposure and developing processes.

Figure 3B:
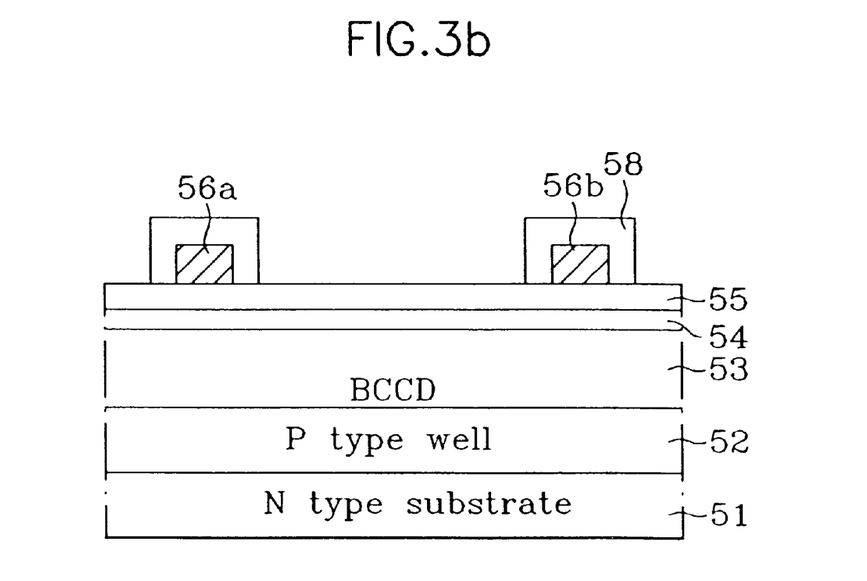

As illustrated in FIG. 3b, the polysilicon 56 is selectively patterned using the patterned first photoresist 57 as a mask to form an offset gate 56a and a reset gate 56b at a predetermined interval.

Subsequently, an insulating film 58 such as inter poly oxide is formed on the entire surface of the N type semiconductor substrate 51 including the offset gate 56a and the reset gate 56b. The insulating film 58 is selectively removed to remain at top portions and side portions of the offset gate 56a and the reset gate 56b.

Figure 3C:
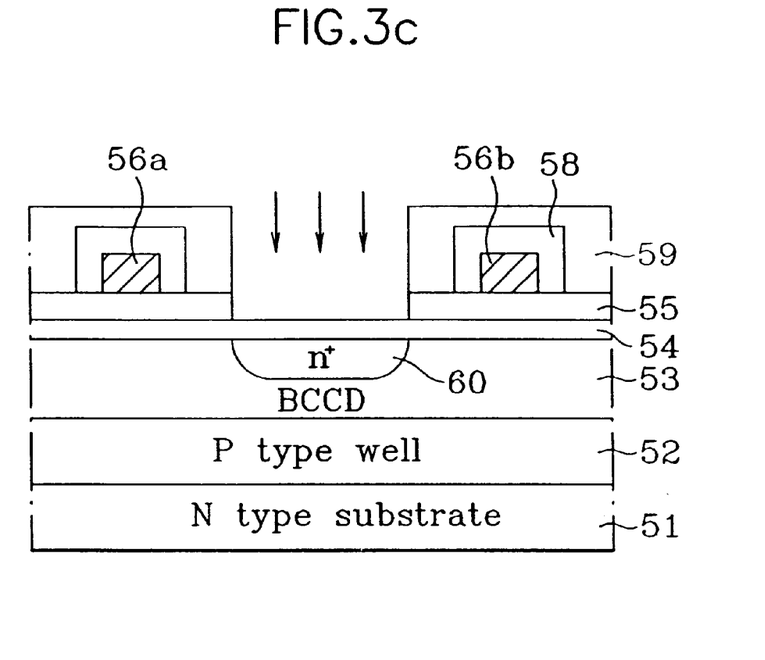

As illustrated in FIG. 3c, a second photoresist 59 is deposited on the entire surface of the N type semiconductor substrate 51 including the oxide film 58 and patterned by exposure and developing processes.

The nitride film 55 is then selectively removed using the patterned second photoresist 59 as a mask to partially expose a surface of the gate oxide film 54.

Thereafter, impurity ions are implanted into the entire surface of the N type semiconductor substrate 51 using the patterned second photoresist 59 as a mask to form a floating diffusion region 60 for ohmic contact in a predetermined region of the BCCD 53.

Figure 3D:
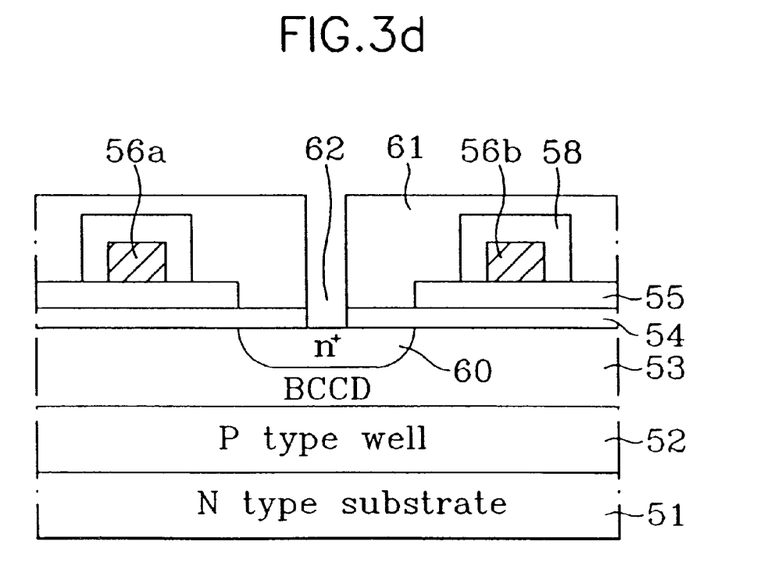

As illustrated in FIG. 3d, the second photoresist 59 is removed. A third photoresist 61 which serves as a mask layer is deposited on the entire surface of the N type semiconductor substrate 51 and patterned by exposure and developing processes.

Subsequently, the gate oxide film 54 is selectively removed using the patterned third photoresist 61 as a mask to partially expose a surface of the floating diffusion region 60, so that a contact hole 62 is formed.

Figure 3E:
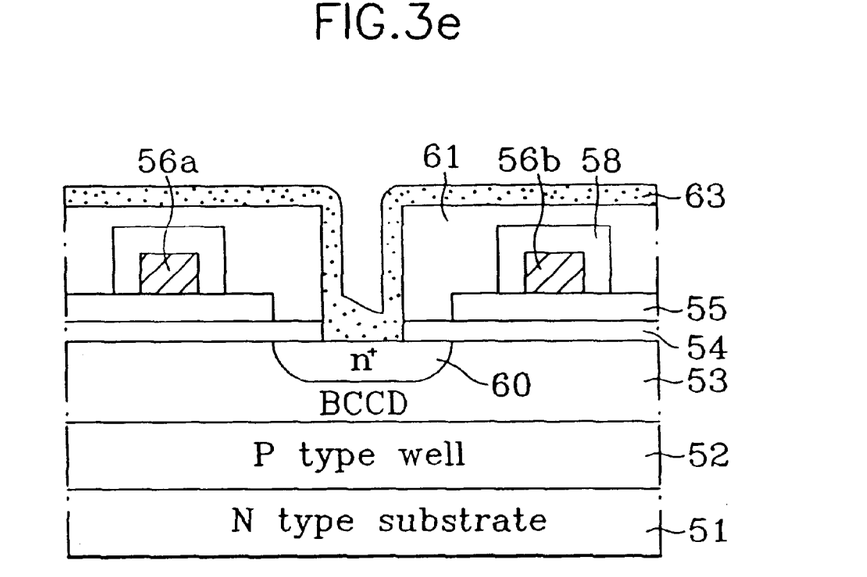

As illustrated in FIG. 3e, a metal layer 63 is formed on the entire surface of the N type semiconductor substrate 61 including the contact hole 62.

Figure 3F:
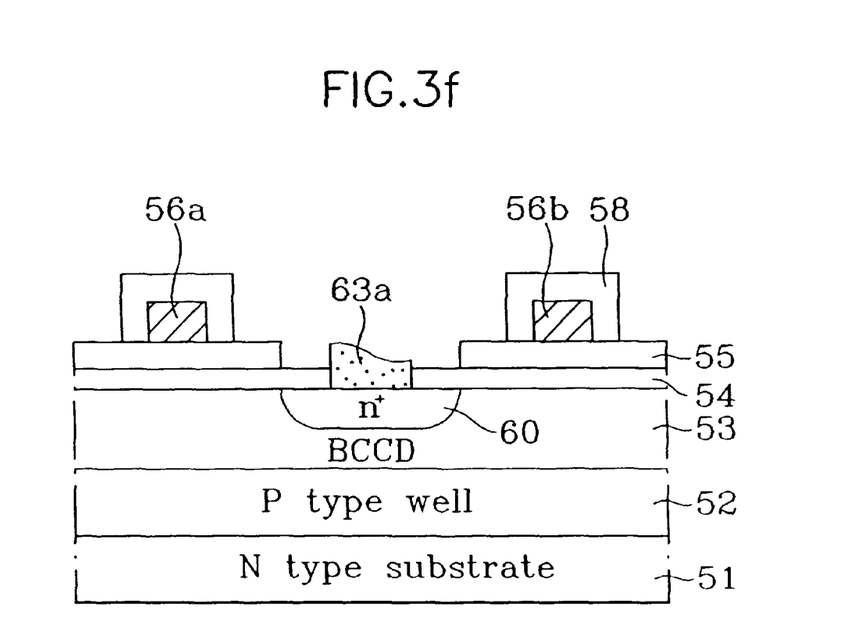

As illustrated in FIG. 3f, the third photoresist 61 is removed by lift off process to form a floating gate 63a which outputs image charges in ohmic contact with the floating diffusion region 60 to peripheral circuits (not shown). In the lift off process, the third photoresist 61 is removed with being separated from the metal layer 63 thereon if ultrasonic is applied to the third photoresist and the metal layer in a detergent liquid such as acetone. At this time, the metal layer 63 is also removed. Such lift off process is generally used in process steps of fabricating a compound semiconductor.

In other words, the metal layer 63 formed on the third photoresist 61 is removed at the same time when the third photoresist 61 is removed by lift off process. Thus, the floating gate 63a can be formed in such a manner that the metal layer on the floating diffusion region 60 on which the third photoresist is not deposited is in ohmic contact with the floating diffusion region at a minimum range.

The method for fabricating the CCD image sensor according to the present invention has the following advantages.

Since the floating gate is formed in contact with the floating diffusion region at a minimum range, parasitic capacitance does not occur, thereby increasing the sensing voltage of the floating diffusion region.

It will be apparent to those skilled in the art that various modifications and variations can be made in the method for fabricating the CCD image sensor of the present invention without departing from the spirit or scope of the invention. Thus, it is intended that the present invention cover the modifications and variations of the invention provided they come within the scope of the appended claims and their equivalents.

What is claimed is:

1. A method for fabricating a charge coupled device (CCD) image sensor comprising the steps of:

forming a P type well in a semiconductor substrate;

forming a buried charge coupled device (BCCD) in the P type well;

forming an offset gate and a reset gate on the BCCD;

forming a floating diffusion region in the BCCD between the offset gate and the reset gate;

forming a mask layer over the semiconductor substrate, the offset gate and the reset gate, the mask layer having a contact hole over the floating diffusion region;

forming a metal layer over the semiconductor substrate and the mask layer and within the contact hole; and selectively removing the metal layer and the mask layer to form a floating gate in the contact hole over the floating diffusion region.

2. The method for fabricating the CCD image sensor as claimed in claim 1, further comprising the step of forming a gate insulating film between the BCCD and the offset gate and between the BCCD and the reset gate.

3. The method for fabricating the CCD image sensor as claimed in claim 2, further comprising the step of forming a nitride film between the gate insulating film and the offset gate and between the gate insulating film and the reset gate.

4. The method for fabricating the CCD image sensor as claimed in claim 1, further comprising the step of forming an insulating film at top portions and side portions of the offset gate and the reset gate.

5. The method for fabricating the CCD image sensor as claimed in claim 1, wherein the mask layer includes a photoresist.

6. The method for fabricating the CCD image sensor as claimed in claim 1, wherein the floating diffusion region and the floating gate are in ohmic contact with each other.

7. The method for fabricating the CCD image sensor as claimed in claim 1, wherein the step of forming the floating diffusion region in the BCCD between the offset gate and the reset gate includes the steps of:

forming a nitride film over the semiconductor substrate;

forming a photoresist pattern over the nitride film;

selectively removing the nitride film between the offset gate and the reset gate using the photoresist pattern to mask portions of the nitride film; and implanting impurity ions into the semiconductor substrate.

8. The method for fabricating the CCD image sensor as claimed in claim 1, wherein the step of selectively removing the metal layer and the mask layer includes the step of applying ultrasonic vibration to the mask layer and the metal layer in a detergent liquid.

9. The method for fabricating the CCD image sensor as claimed in claim 8, wherein the detergent liquid is acetone.

* * * * *